(12) United States Patent
Doany et al.

(10) Patent No.: US 10,937,671 B2
(45) Date of Patent: *Mar. 2, 2021

(54) CONDUCTIVE HEAT SPREADER AND HEAT SINK ASSEMBLY FOR OPTICAL DEVICES

(71) Applicant: International Business Machines Corporation, Armonk, NY (US)

(72) Inventors: Fuad Elias Doany, Katonah, NY (US); Mark Schultz, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 116 days.

This patent is subject to a terminal disclaimer.

(21) Appl. No.: 16/358,383

(22) Filed: Mar. 19, 2019

(65) Prior Publication Data

US 2019/0214280 A1    Jul. 11, 2019

Related U.S. Application Data

(63) Continuation of application No. 15/827,562, filed on Nov. 30, 2017, now Pat. No. 10,269,592.

(51) Int. Cl.
*H01L 21/67* (2006.01)
*H01L 23/00* (2006.01)
(Continued)

(52) U.S. Cl.
CPC ...... *H01L 21/67103* (2013.01); *G02B 6/4268* (2013.01); *H01L 21/486* (2013.01);
(Continued)

(58) Field of Classification Search
CPC ............. H01L 21/67103; H01L 21/486; H01L 21/4882; H01L 23/3107; H01L 23/36;
(Continued)

(56) References Cited

U.S. PATENT DOCUMENTS 6,320,257 B1    11/2001   Jayaraj et al.
7,723,730 B2    5/2010    Groetsch et al.
(Continued)

FOREIGN PATENT DOCUMENTS

WO    2013/016731 A1    1/2013

OTHER PUBLICATIONS

Non-Final Office Action received for U.S. Appl. No. 15/827,562 dated Jun. 29, 2018, 19 pages.
(Continued)

*Primary Examiner* — Tu-Tu V Ho
(74) *Attorney, Agent, or Firm* — Amin, Turocy & Watson, LLP

(57) ABSTRACT

Matching of coefficient of thermal expansion for heat spreaders and carrier die can facilitate optoelectronic die alignment. In one example, an apparatus comprises a carrier die comprising a first coefficient of thermal expansion, two or more optoelectronic die disposed on the carrier die, and a spreader. The spreader can comprise a second material coefficient of thermal expansion matched to the first coefficient of thermal expansion. Additionally, a thermal interface material is disposed between the spreader and the one or more optoelectronic die.

20 Claims, 11 Drawing Sheets

(51) Int. Cl.
*H01L 21/48* (2006.01)
*H05K 7/20* (2006.01)
*H01L 23/36* (2006.01)
*H01L 23/31* (2006.01)
*H01R 12/72* (2011.01)
*G02B 6/42* (2006.01)
*H01S 5/024* (2006.01)
*H01L 25/065* (2006.01)
*H01S 5/40* (2006.01)

(52) U.S. Cl.
CPC ...... *H01L 21/4882* (2013.01); *H01L 23/3107* (2013.01); *H01L 23/36* (2013.01); *H01L 24/49* (2013.01); *H01L 25/0655* (2013.01); *H01R 12/722* (2013.01); *H01S 5/02476* (2013.01); *H05K 7/20509* (2013.01); *H01L 24/29* (2013.01); *H01L 24/32* (2013.01); *H01L 24/83* (2013.01); *H01L 2224/291* (2013.01); *H01L 2224/29007* (2013.01); *H01L 2224/2919* (2013.01); *H01L 2224/29109* (2013.01); *H01L 2224/32245* (2013.01); *H01L 2224/834* (2013.01); *H01L 2224/8385* (2013.01); *H01L 2224/83203* (2013.01); *H01L 2224/83801* (2013.01); *H01L 2924/12042* (2013.01); *H01L 2924/15159* (2013.01); *H01S 5/02469* (2013.01); *H01S 5/4025* (2013.01)

(58) Field of Classification Search
CPC ......... H01L 24/29; H01L 24/32; H01L 24/49; H01L 24/83; H01L 25/0655; H01L 2224/29007; H01L 2224/291; H01L 2224/29109; H01L 2224/2919; H01L 2224/32245; H01L 2224/83203; H01L 2224/834; H01L 2224/83801; H01L 2224/8385; H01L 2924/12042; H01L 2924/15159; G02B 6/4268; H01R 12/722; H01S 5/02476; H01S 5/02469; H01S 5/4025; H05K 7/20509

USPC .......................................................... 257/99
See application file for complete search history.

(56) References Cited

U.S. PATENT DOCUMENTS

| | | | |
|---|---|---|---|
| 8,852,378 | B2 | 10/2014 | Huff et al. |
| 9,080,752 | B2 | 7/2015 | Woodgate et al. |
| 9,653,670 | B2 | 5/2017 | Illek et al. |
| 10,269,592 | B1* | 4/2019 | Doany ................ H01L 25/0655 |
| 2004/0046248 | A1 | 3/2004 | Waelti et al. |
| 2007/0080362 | A1 | 4/2007 | Scotch et al. |
| 2010/0108254 | A1 | 5/2010 | Huff et al. |
| 2010/0309940 | A1 | 12/2010 | Lee |
| 2013/0272694 | A1 | 10/2013 | Sandstrom |
| 2016/0003563 | A1 | 1/2016 | Dutta |
| 2016/0087726 | A1 | 3/2016 | Roberds et al. |
| 2017/0040768 | A1 | 2/2017 | Waclawik |

OTHER PUBLICATIONS

Enright et al., "Integrated Thermoelectric Cooling for Silicon Photonics," ECS Journal of Solid Slate Science and Technology, vol. 6, No. 3, 2017, 10 pages.
List of IBM Patents or Applications Treated as Related.

* cited by examiner

900

902 — ATTACHING TWO OR MORE OPTOELECTRONICS DEVICES TO A SILICON PHOTONICS DIE, WHEREIN THE SILICON PHOTONICS DIE COMPRISES A FIRST MATERIAL COEFFICIENT OF THERMAL EXPANSION

904 — ATTACHING A SPREADER TO THE TWO OR MORE OPTOELECTRONICS DEVICES, VIA A THERMAL INTERFACE MATERIAL, WHEREIN THE SPREADER COMPRISES A SECOND MATERIAL COEFFICIENT OF THERMAL EXPANSION MATCHED TO THE FIRST MATERIAL COEFFICIENT OF THERMAL EXPANSION

906 — DEPOSITING A CONDUCTIVE LAYER ON THE THERMAL INTERFACE MATERIAL PRIOR TO THE ATTACHING THE SPREADER TO THE TWO OR MORE OPTOELECTRONICS DEVICES

FIG. 9

```
                                              ┌─ 1000
1002 ─┐
       ┌─────────────────────────────────────────────┐
       │  ATTACHING TWO OR MORE OPTOELECTRONICS       │
       │  DEVICES TO A SILICON PHOTONICS DIE, WHEREIN THE │
       │  SILICON PHOTONICS DIE COMPRISES A FIRST     │
       │  MATERIAL COEFFICIENT OF THERMAL EXPANSION   │
       └─────────────────────────────────────────────┘
                          │
1004 ─┐                   ▼
       ┌─────────────────────────────────────────────┐
       │  ATTACHING A SPREADER TO THE TWO OR MORE     │
       │  OPTOELECTRONICS DEVICES, VIA A THERMAL      │
       │  INTERFACE MATERIAL, WHEREIN THE SPREADER    │
       │  COMPRISES A SECOND MATERIAL COEFFICIENT OF  │
       │  THERMAL EXPANSION MATCHED TO THE FIRST      │
       │  MATERIAL COEFFICIENT OF THERMAL EXPANSION   │
       └─────────────────────────────────────────────┘
                          │
1006 ─┐                   ▼
       ┌─────────────────────────────────────────────┐
       │  ENCASING THE SPREADER IN A CONDUCTIVE LAYER │
       │  PRIOR TO THE ATTACHING THE SPREADER TO THE TWO │
       │  OR MORE OPTOELECTRONICS DEVICES             │
       └─────────────────────────────────────────────┘
```

FIG. 10

CONDUCTIVE HEAT SPREADER AND HEAT SINK ASSEMBLY FOR OPTICAL DEVICES

STATEMENT REGARDING FEDERALLY SPONSORED RESEARCH OR DEVELOPMENT

This invention was made with Government support under B621073 awarded by the Department of Energy. The Government has certain rights to this invention.

BACKGROUND

The subject disclosure relates to optical devices, and more particularly to a conductive heat spreader and heat sink assembly for optical devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods that facilitate production of a heat spreader and heat sink assembly are described.

According to an embodiment, a system is provided. The system can comprise a carrier die comprising a first coefficient of thermal expansion, and two or more optoelectronic die disposed on the carrier die. The system can also comprise a spreader comprising a second material coefficient of thermal expansion matched to the first coefficient of thermal expansion. Additionally, the system can comprise a thermal interface material disposed between the spreader and the two or more optoelectronic die.

According to another embodiment, an apparatus is provided. The apparatus can comprise a spreader comprising a first material coefficient of thermal expansion and two or more laser die. The apparatus can also comprise a thermal interface material between the spreader and the two or more laser die. Additionally, the apparatus can comprise a silicon photonics die adjacent to the two or more laser die, and comprising a second material coefficient of thermal expansion that is matched to the first material coefficient of thermal expansion.

According to yet another embodiment, a method is provided. The method can comprise attaching two or more optoelectronics devices to a silicon photonics die, wherein the silicon photonics die comprises a first material coefficient of thermal expansion. The method can also comprise attaching a spreader to the two or more optoelectronics devices, via a thermal interface material, wherein the spreader comprises a second material coefficient of thermal expansion matched to the first material coefficient of thermal expansion.

These and other features and advantages will become apparent from the following detailed description of illustrative embodiments thereof, which is to be read in connection with the accompanying drawings.

DESCRIPTION OF THE DRAWINGS

FIG. 9 illustrates a non-limiting flow diagram of another example, non-limiting method for developing a heat sink assembly in accordance with one or more embodiments described herein.

FIG. 10 illustrates a non-limiting flow diagram of another example, non-limiting method for developing a heat sink assembly in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It is to be understood that the present disclosure can be described in terms of a given illustrative architecture comprising a heat sink assembly; however, other architectures, structures, materials and process features and steps can be varied within the scope of the present invention.

It should also be understood that when an element such as an interface layer, load, etc. is referred to as being "on" or "over" another element, it can be directly on the other element or intervening elements can also be present. In contrast, when an element is referred to as being "directly on" or "directly over" another element, there are no intervening elements present. It should also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

To remove heat from two or more optoelectronics devices attached to a carrier die, a heat spreader material's coefficient of thermal expansion (CTE) can be matched to that of material associated with the carrier die. For example, when laser die are attached to a silicon photonics die, given that the laser die need to have an electrical contact to the silicon photonics die, heat can cause the carrier die to expand in many cases. However, if a copper heat spreader is attached to multiple laser die, then the CTE will not be matched to the underlying silicon photonics die. Thus, if the temperature of the heat sink assembly changes, then additional stress can be placed on the laser die.

Figure 1:
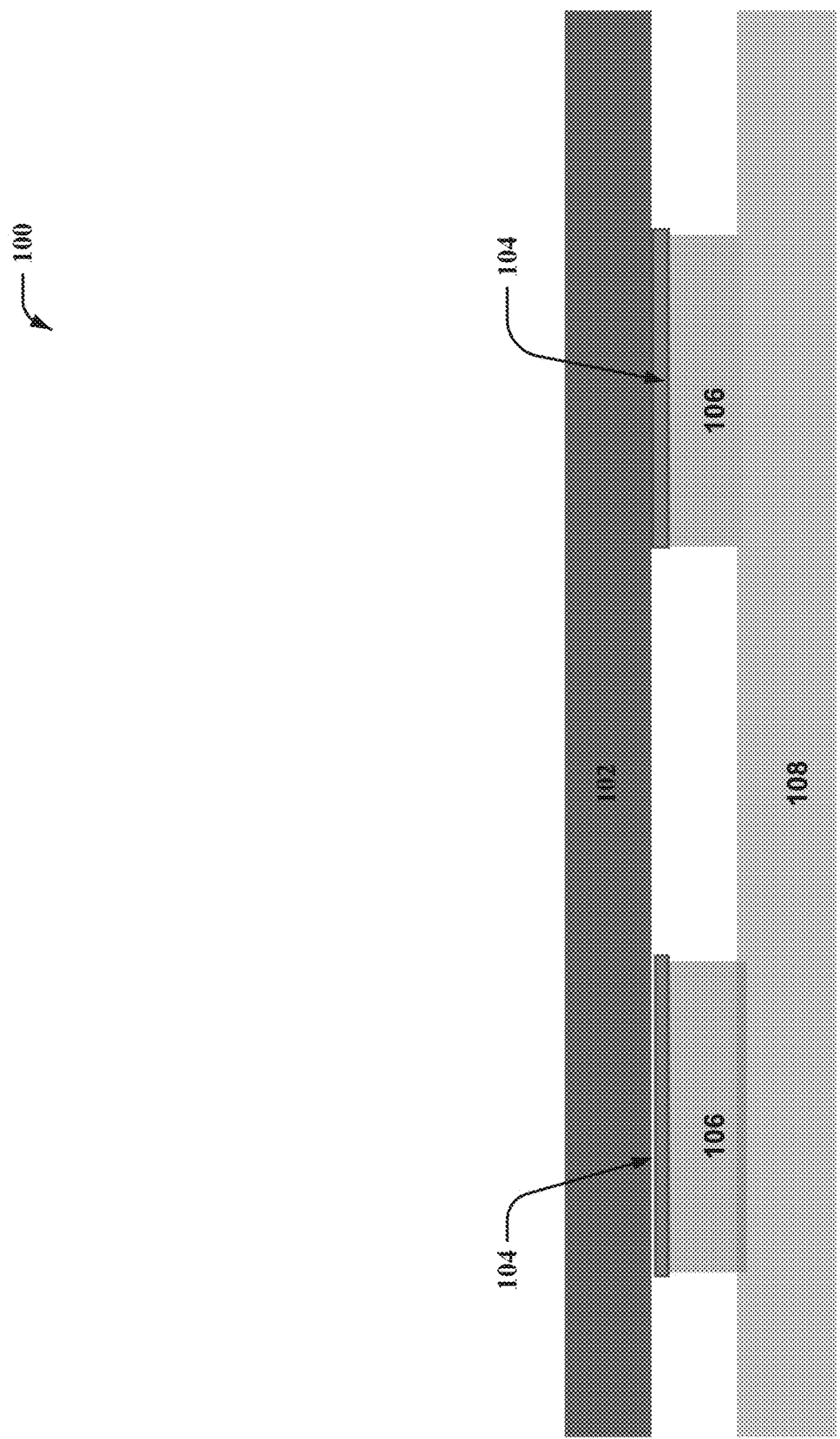
FIG. 1 illustrates a non-limiting side view of a heat sink assembly in accordance with one or more embodiments described herein.

FIG. 1 illustrates a non-limiting side view of a heat sink assembly in accordance with one or more embodiments described herein. In FIG. 1, a heat sink assembly 100 is shown.

In some embodiments, a heat sink assembly 100 can comprise a carrier die 108, laser die 106, and a spreader 102. The carrier die 108 can be a silicon photonics die. However, it should be noted that in other embodiments different die variations are possible. For example, laser die 106 can be a semiconductor optical amplifier die, a photonic modulator die, an electronics die, a laser die, and/or a photodetector, etc. can be used in conjunction with the heat sink assembly 100.

Materials can be matched based on their coefficient of thermal expansion (CTE). For example, a silicon photonics die can be matched to a heat spreader (e.g., silicon heat spreader, silicon carbide heat spreader, etc.) with the same CTE. A heat spreader is a heat exchanger that moves heat between a heat source and a secondary heat exchanger whose surface area and geometry are more favorable than the source. Such a spreader is most often simply a plate made of copper, which has a high thermal conductivity. By definition, heat is "spread out" over this geometry, so that the secondary heat exchanger can be more fully utilized. However, this has the potential to increase the heat capacity of the total assembly, but the presence of an additional thermal junction can limit total thermal capacity. The high conduction properties of the spreader can make it more effective to function as an air heat exchanger, as opposed to the original source. The low heat conduction of air in convection can be matched by the higher surface area of the spreader, and heat is radiated more effectively. A heat spreader is generally used when the heat source tends to have a high heat-flux density, (e.g., high heat flow per unit area), and heat cannot be conducted away effectively by the secondary heat exchanger.

A silicon photonics die (as a carrier die) can be large and comprise multiple laser or optical device die. However, if a thermal spreader is placed on top of the multiple die, then the CTE of the spreader can be matched to the silicon photonics die instead of the CTE of the laser die. Without a CTE matched spreader, as the temperature of the heat sink assembly increases, the distance between the laser die can change based on the thermal expansion by a different amount than that of the spreader. Since lasers are delicate devices and typically aligned to sub-micron accuracy, if a spreader's CTE is different than the silicon photonic die CTE, then the resulting movement can stress the laser die when the temperature changes. Therefore, mitigating temperature increase and maintaining laser alignment can improve heat sink assembly performance as it experiences thermal cycling.

As depicted in FIG. 1, the laser die 106 can be disposed on the carrier die 108. The carrier die 108 can have a first CTE associated with the material that the carrier die 108 comprises. The spreader 102 can be attached to the laser die 106 via a thermal interface material 104 and comprise a second CTE. The thermal interface material 104 can comprise a solder, a thermal compression bonded metal, indium, a high performance inductive loaded polymer, and/or a metal layer bonded to the laser die 106 and the spreader 102. To mitigate the effects of thermal expansion, the CTE of the spreader 102 and the CTE of the carrier die 108 can be matched.

Figure 2:
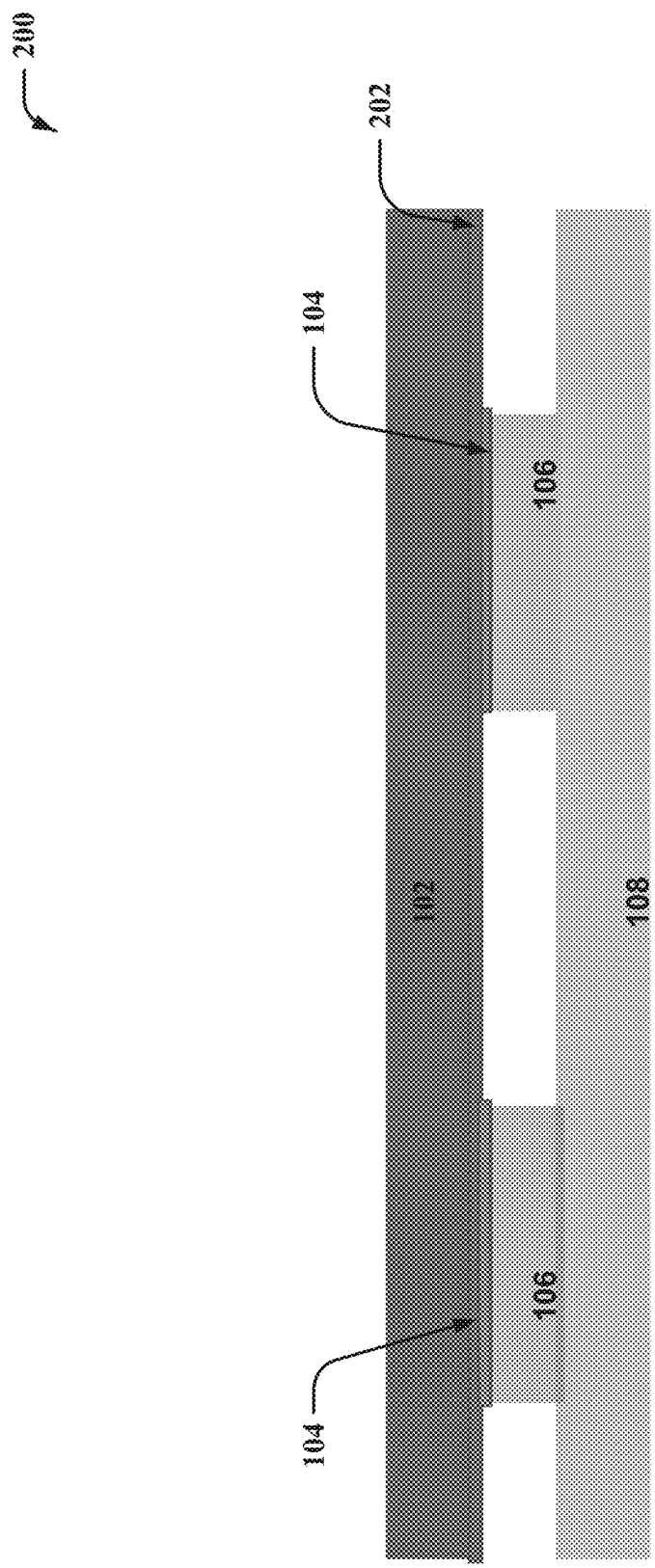
FIG. 2 illustrates a non-limiting side view of a heat sink assembly comprising a conductive layer in accordance with one or more embodiments described herein.

FIG. 2 illustrates a non-limiting side view of a heat sink assembly comprising a conductive layer in accordance with one or more embodiments described herein. Repetitive description of like elements employed in other embodiments described herein is omitted for sake of brevity.

In some embodiments, a heat sink assembly 200 can comprise a carrier die 108, laser die 106, a spreader 102, and an electrically conductive layer 202. The carrier die 108 can be a silicon photonics die. However, it should be noted that in other embodiments different die variations are possible. For example, the die can be a photonic modulator die, an electronics die, a laser die, and/or a photodetector, etc. can be used.

Materials can be matched based on their coefficient of thermal expansion (CTE). For example, a silicon photonics die can be matched to a spreader (e.g., heat spreader) with the same CTE. The silicon photonics die can be large and comprise multiple laser die. However, if a thermal spreader is placed on top of the laser die, then the CTE of the spreader can be matched to the silicon photonics die instead of the lasers. Without a CTE matched spreader, as the temperature of the heat sink assembly increases, the distance between the laser die can change based on thermal expansion by an amount different from that of the attached spreader. Since lasers are delicate devices and typically aligned to sub-micron accuracy, if a spreader's CTE is different than the silicon photonic die CTE, then the resulting movement can stress the laser die when the temperature varies. Therefore, maintaining laser alignment can improve the heat sink assembly performance as it experiences thermal cycling.

As depicted in FIG. 2, the laser die 106 can be disposed on the carrier die 108. The carrier die 108 can have a first CTE associated with the material that the carrier die 108 comprises. An electrically conductive layer 202 can be disposed between the spreader 102 a thermal interface material 104. The electrically conductive layer 202 can facilitate the transport of an electric charge, and the spreader 102 can comprise a second CTE. Furthermore, the thermal interface material 104 can comprise a solder, a thermal compression bonded metal, indium, a high performance inductive loaded polymer, and/or a metal layer bonded to the laser die 106 and the spreader 102. To mitigate the effects of thermal expansion, the CTE of the spreader 102 and the CTE of the carrier die 108 can be matched.

Figure 3:
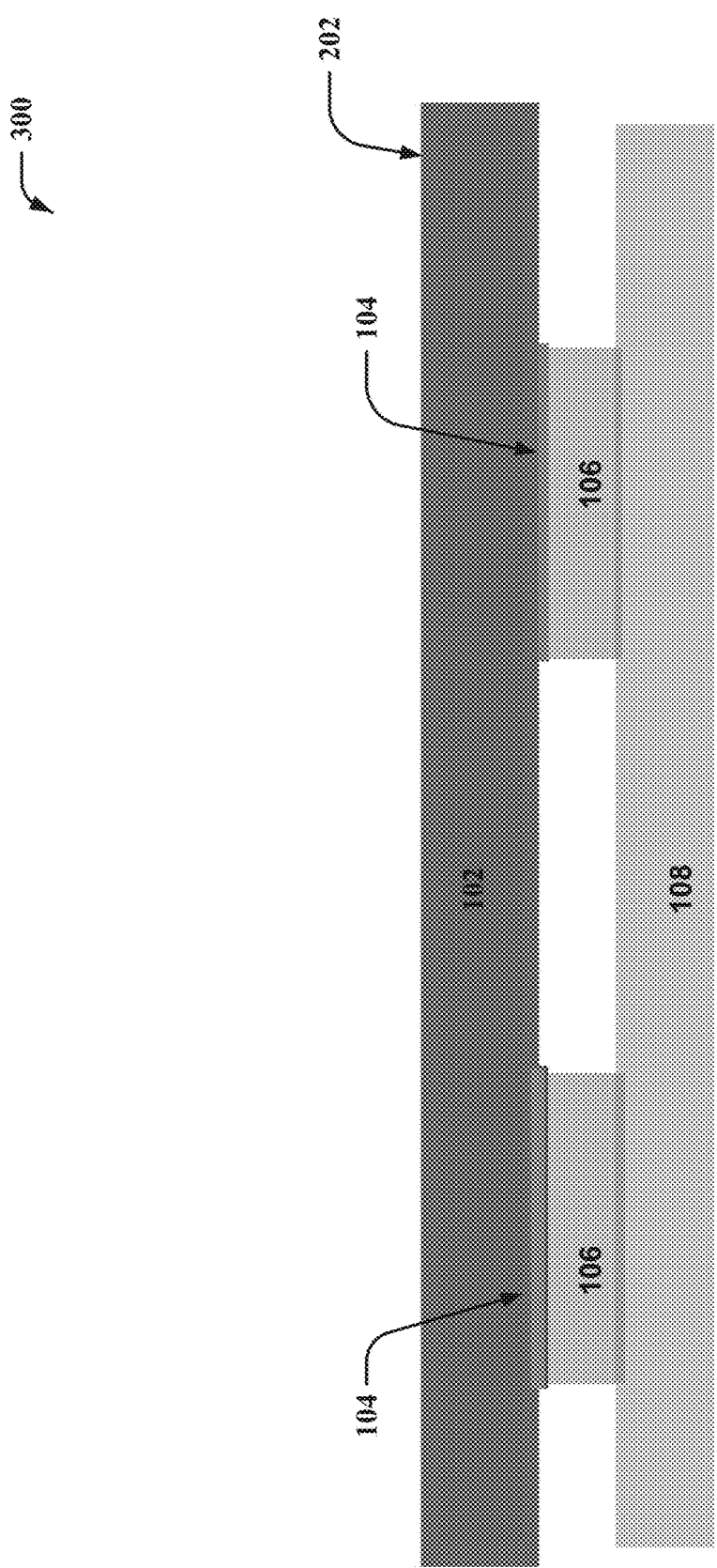
FIG. 3 illustrates another non-limiting side view of a heat sink assembly comprising a conductive layer surrounding a spreader in accordance with one or more embodiments described herein.

FIG. 3 illustrates another non-limiting side view of a heat sink assembly comprising a conductive layer surrounding the spreader in accordance with one or more embodiments described herein. Repetitive description of like elements employed in other embodiments described herein is omitted for sake of brevity.

In some embodiments, a heat sink assembly 300 can comprise a carrier die 108, laser die 106, a spreader 102, and an electrically conductive layer 202. The carrier die 108 can be a silicon photonics die. However, it should be noted that in other embodiments different carrier die variations are possible. For example, the die can be a semiconductor optical amplifier die, a photonic modulator die, an electronics die, a laser die, and/or a photodetector, etc. can be used in conjunction with the heat sink assembly 300.

Materials can be matched based on their coefficient of thermal expansion (CTE). For example, a silicon photonics die can be matched to a spreader (e.g., heat spreader) with the same CTE. The silicon photonics die can be large and comprise multiple laser die. However, if a thermal spreader is placed on top of the laser die, then the CTE of the spreader can be matched to the silicon photonics die instead of the lasers. Without a CTE matched spreader, as the temperature of the heat sink assembly increases, the distance between the laser die can change based on thermal expansion by a different amount than that of the spreader. Since lasers are delicate devices and typically aligned to sub-micron accuracy, if a spreader's CTE is different than the silicon photonic die CTE, then the resulting movement can stress the laser die when the temperature varies. Therefore, maintaining laser alignment can improve the heat sink assembly performance as it experiences thermal cycling.

As depicted in FIG. 3, the laser die 106 can be disposed on the carrier die 108. The carrier die 108 can have a first CTE associated with the material that the carrier die 108 comprises. An electrically conductive layer 302 can surround the spreader 102 and be attached to the laser die 106 via a thermal interface material 104 for an easier electrical connection. Consequently, the electrically conductive layer 202 can facilitate the transport of an electric charge. In this embodiment, the electric charge can be provided through the top surface of the spreader. It should also be understood that the electrical signal can be external to the carrier die 108. Wrapping the conductor around the spreader allows contact to the conducting element from the top of the spreader rather than the bottom. The spreader 102 can comprise a second CTE that is the same as the first CTE. The thermal interface material 104 can comprise a solder, a thermal compression bonded metal, indium, a high performance inductive loaded polymer, and/or a metal layer bonded to the laser die 106 and the spreader 102. Thus, to mitigate the effects of thermal expansion, the CTE of the spreader 102 and the CTE of the carrier die 108 can be matched.

Figure 4:
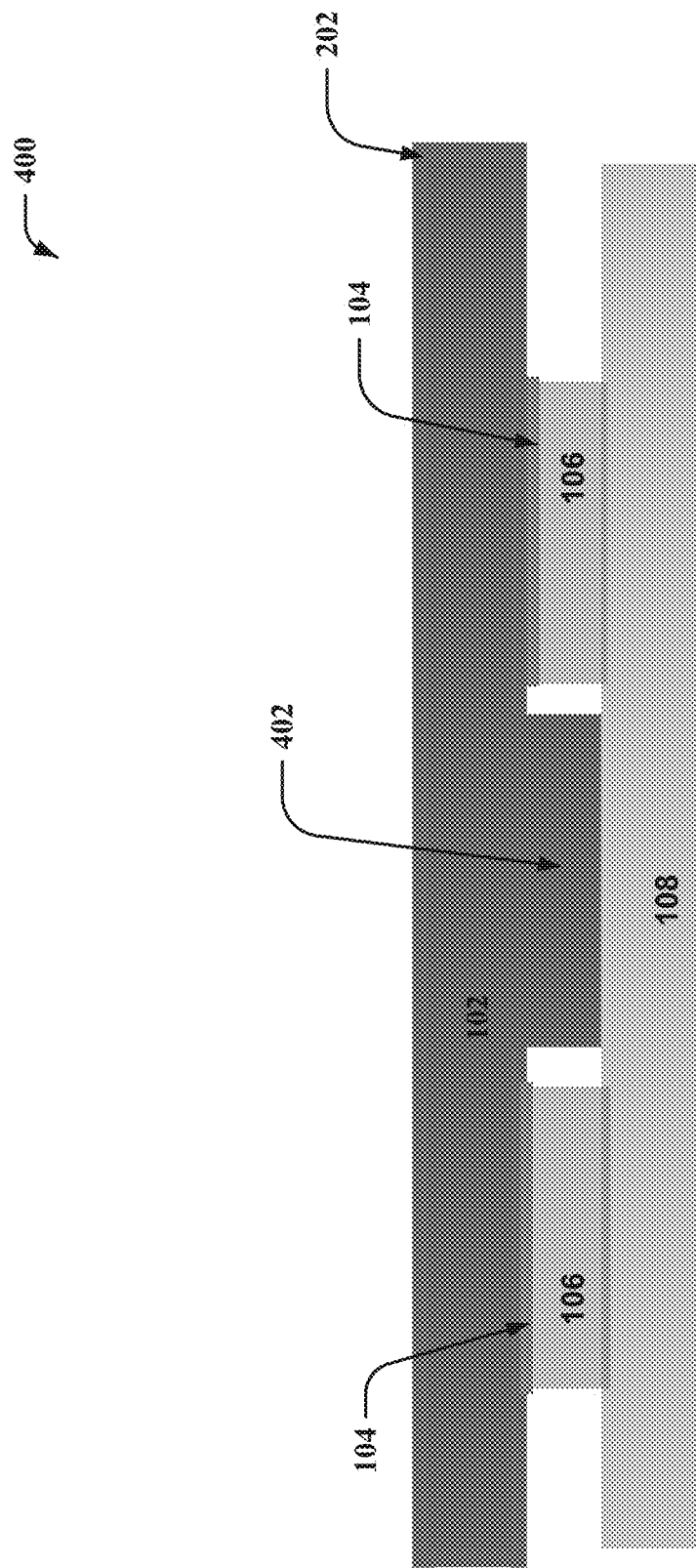
FIG. 4 illustrates a non-limiting side view of a heat sink assembly comprising a column in accordance with one or more embodiments described herein.

FIG. 4 illustrates a non-limiting side view of a heat sink assembly comprising a column in accordance with one or more embodiments described herein. Repetitive description of like elements employed in other embodiments described herein is omitted for sake of brevity.

In some embodiments, a heat sink assembly 400 can comprise a carrier die 108, laser die 106, a spreader 102, and an electrically conductive layer 202. The carrier die 108 can be a silicon photonics die. However, it should be noted that in other embodiments different die variations are possible. For example, the die can be a semiconductor optical amplifier die, a photonic modulator die, an electronics die, a laser die, and/or a photodetector, etc.

Materials can be matched based on their coefficient of thermal expansion (CTE). For example, a silicon photonics die can be matched to a spreader (e.g., heat spreader) with the same CTE. The silicon photonics die can comprise multiple laser die. However, if a thermal spreader is placed on top of the laser die, then the CTE of the spreader can be matched to the silicon photonics die instead of the lasers. Without a CTE matched spreader, as the temperature of the heat sink assembly 400 increases, the distance between the laser die can change based on thermal expansion by a different amount than that of the spreader. Since lasers are delicate devices and typically aligned to sub-micron accuracy, if a spreader's CTE is different than the silicon photonic die CTE, then the resulting movement can stress the laser die when the temperature varies. Therefore, maintaining laser alignment can improve the heat sink assembly 400 performance as it experiences thermal cycling.

As depicted in FIG. 4, the laser die 106 can be disposed on the carrier die 108. The carrier die 108 can have a first CTE associated with the material that the carrier die 108 comprises. An electrically conductive layer 202 can surround the spreader 102 except for a column 402 formed by the spreader 102, wherein the column 402 is connected to the carrier die 108. In this embodiment, column 402 can provide a mechanical stop to set the gap between the spreader 102 and the laser die 106. This ensures that excessive force is not applied to the laser die 106 during assembly of the spreader 102. The electrically conductive layer 202 can facilitate the transport of an electric charge. In addition, an electrical connection to the heat sink assembly 400 can be provided through the electrically conductive layer 202. It should also be understood that the ground, power, or an electrical signal can be internal or external to the carrier die 108 in alternative embodiments. Sections of the electrically conductive layer 202 can be attached to the laser die 106 via a thermal interface material 104. The spreader 102 can comprise a second CTE matched to the first CTE. Additionally, the thermal interface material 104 can comprise a solder, a thermal compression bonded metal, indium, a high performance inductive loaded polymer, and/or a metal layer bonded to the laser die 106 and the spreader 102. Thus, to mitigate the affects of thermal expansion, the CTE of the spreader 102 and the CTE of the carrier die 108 can be matched.

Figure 5:
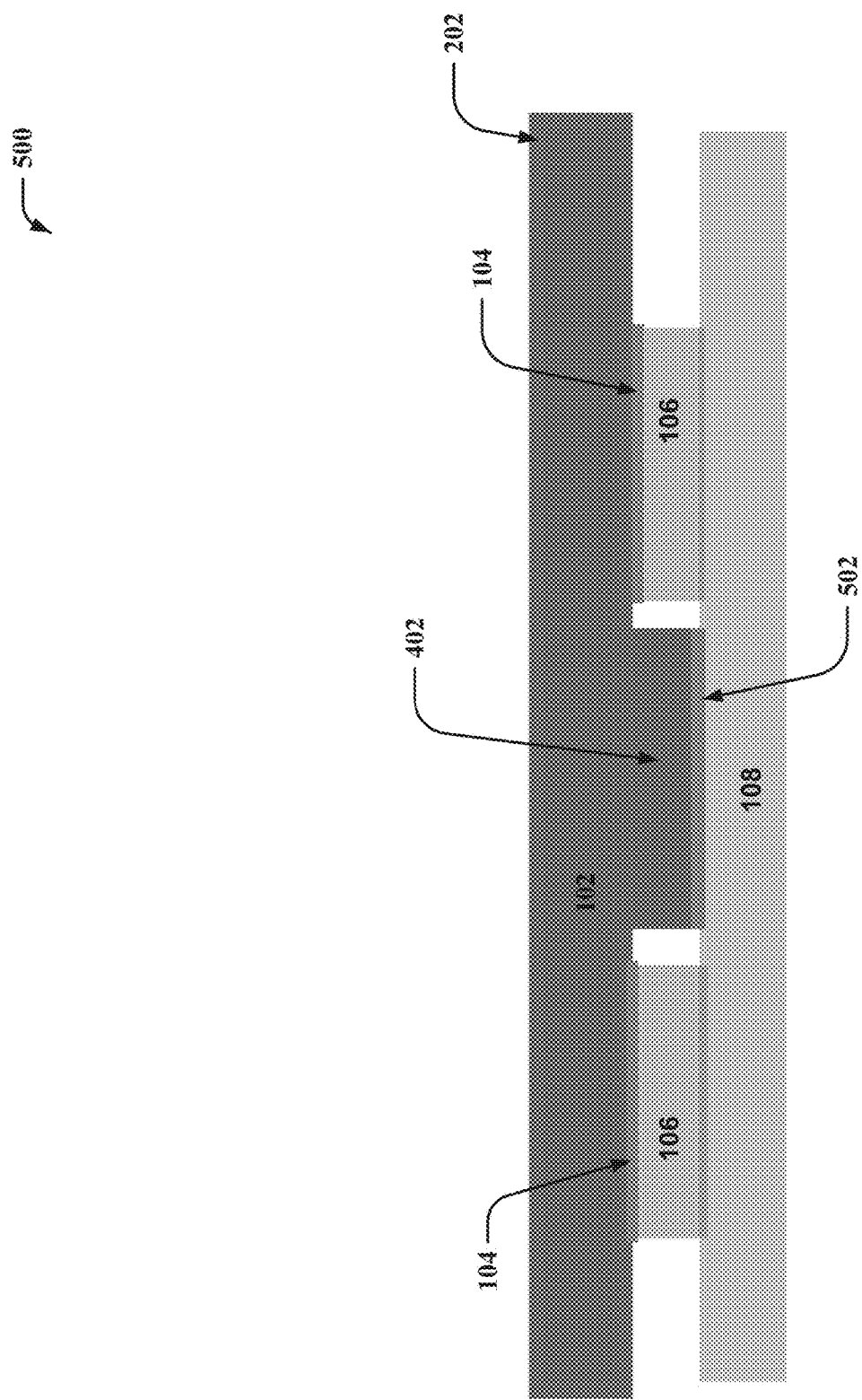
FIG. 5 illustrates a non-limiting side view of a heat sink assembly comprising a column and a thermal interface material in accordance with one or more embodiments described herein.

FIG. 5 illustrates a non-limiting side view of a heat sink assembly comprising a column and a thermal interface material in accordance with one or more embodiments described herein. Repetitive description of like elements employed in other embodiments described herein is omitted for sake of brevity.

In some embodiments, a heat sink assembly 500 can comprise a carrier die 108, laser die 106, a spreader 102, and an electrically conductive layer 202. The carrier die 108 can be a silicon photonics die. However, it should be noted that in other embodiments different die variations are possible. For example, the die can be a semiconductor optical amplifier die, a photonic modulator die, an electronics die, a laser die, and/or a photodetector, etc.

Materials can be matched based on their coefficient of thermal expansion (CTE). For example, a silicon photonics die can be matched to a spreader (e.g., heat spreader) with the same CTE. The silicon photonics die can comprise multiple laser die. However, if a thermal spreader is placed on top of the laser die, then the CTE of the thermal spreader can be matched to the silicon photonics die instead of the CTE of the laser die. Without a CTE matched spreader, as the temperature of the heat sink assembly increases, the distance between the laser die can vary based on thermal expansion by a different amount than that of the spreader. Since lasers are delicate devices and typically aligned to sub-micron accuracy, if a thermal spreader's CTE is different than the silicon photonic die CTE, then the resulting movement can stress the laser die when the temperature varies. Therefore, maintaining laser alignment can improve the heat sink assembly 500 performance as it experiences thermal cycling.

As depicted in FIG. 5, laser die 106 can be disposed on the carrier die 108. The carrier die 108 can have a first CTE associated with the material that the carrier die 108 comprises. An electrically conductive layer 202 can surround the spreader 102 except for a column 402 formed by the spreader 102, wherein the column 402 is connected to the carrier die 108. The column 402 can be connected to the carrier die 108 via a thermal interface material 502. It should be noted that the thermal interface material 502 can be the same or different than the thermal interface material 104 (between the electrically conductive layer 202 and the laser die 106). Sections of the electrically conductive layer 202 can be attached to the laser die 106 via the thermal interface material 104. The electrically conductive layer 202 can facilitate the transport of an electric charge. The spreader 102 can comprise a second CTE matched to the first CTE. Additionally, the thermal interface material 104 can comprise a solder, a thermal compression bonded metal, indium, a high performance inductive loaded polymer, and/or a metal layer bonded to the laser die 106 and the spreader 102. Thus, to mitigate the effects of thermal expansion, the CTE of the spreader 102 and the CTE of the carrier die 108 can be matched.

Figure 6:
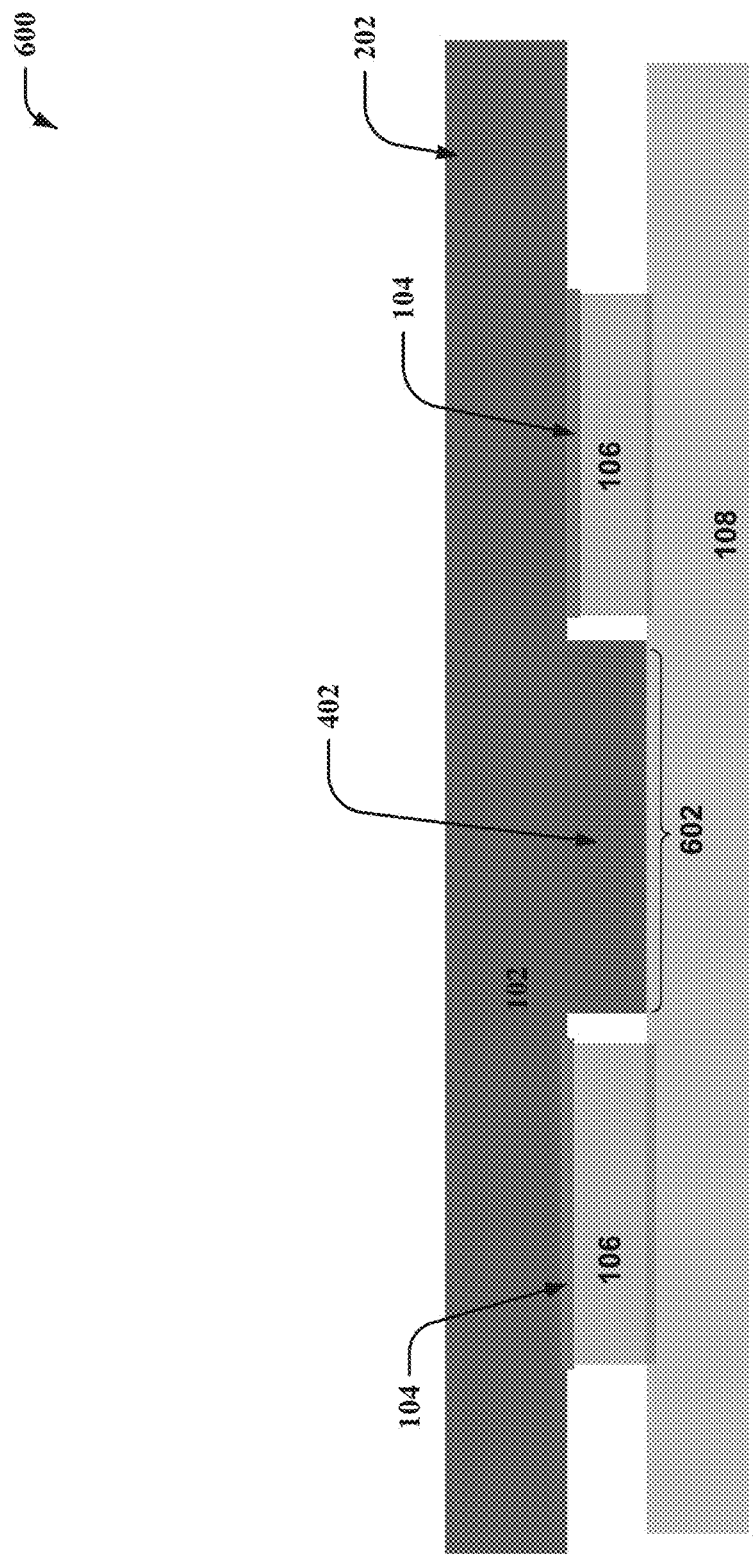
FIG. 6 illustrates a non-limiting side view of a heat sink assembly comprising a column, a thermal interface material, and a conductive layer that surrounds a spreader and the column in accordance with one or more embodiments described herein.

FIG. 6 illustrates a non-limiting side view of a heat sink assembly comprising a column, a thermal interface material, and a conductive layer that surrounds the heat spreader and the column in accordance with one or more embodiments described herein. Repetitive description of like elements employed in other embodiments described herein is omitted for sake of brevity.

In some embodiments, a heat sink assembly 600 can comprise a carrier die 108, laser die 106, a spreader 102, and an electrically conductive layer 202. The carrier die 108 can be a silicon photonics die. However, it should be noted that in other embodiments different die variations are possible. For example, the die can be a semiconductor optical amplifier die, a photonic modulator die, an electronics die, a laser die, and/or a photodetector, etc.

Materials can be matched based on their coefficient of thermal expansion (CTE). For example, a silicon photonics die can be matched to a spreader (e.g., heat spreader) with the same CTE. The silicon photonics die can comprise multiple laser die. However, if a thermal spreader is placed on top of the laser die, then the CTE of the thermal spreader can be matched to the silicon photonics die instead of the CTE of the lasers. Without a CTE matched spreader, as the temperature of the heat sink assembly 600 increases, the distance between the laser die 106 can vary based on thermal expansion by a different amount than that of the spreader. Since laser die 106 are delicate devices and typically aligned to sub-micron accuracy, if a spreader's 102 CTE is different than the silicon photonic die (e.g., carrier die 108) CTE, then the resulting movement can stress the laser die 106 when the temperature varies. Therefore, maintaining laser die 106 alignment can improve the heat sink assembly 600 performance as it experiences thermal cycling.

As depicted in FIG. 6, the laser die 106 can be disposed on the carrier die 108. The carrier die 108 can have a first CTE associated with the material that the carrier die 108 comprises. An electrically conductive layer 202 can surround the spreader 102 including a column 402 formed by the spreader 102, wherein the column 402 is connected to the carrier die 108. The column 402 provides a mechanical stop to set the gap between the spreader 102 and the laser die 106. This ensures that excessive force is not applied to the laser die 106 during assembly of the spreader 102. In addition, the column 402 can be connected to the carrier die 108 via the electrically conductive layer 602. An electrical connection between the heat sink assembly 600 and the carrier die 108 can be provided through electrically conductive layer 602. Sections of the electrically conductive layer 202 can be attached to the laser die 106 via the thermal interface material 104. The electrically conductive layer 202, 602 can facilitate the transport of an electric charge. The spreader 102 can comprise a second CTE. Additionally, the thermal interface material 104 can comprise a solder, a thermal compression bonded metal, indium, a high performance inductive loaded polymer, and/or a metal layer bonded to the laser die 106 and the spreader 102. Thus, to mitigate the effects of thermal expansion, the CTE of the spreader 102 and the CTE of the carrier die 108 can be matched.

Figure 7:
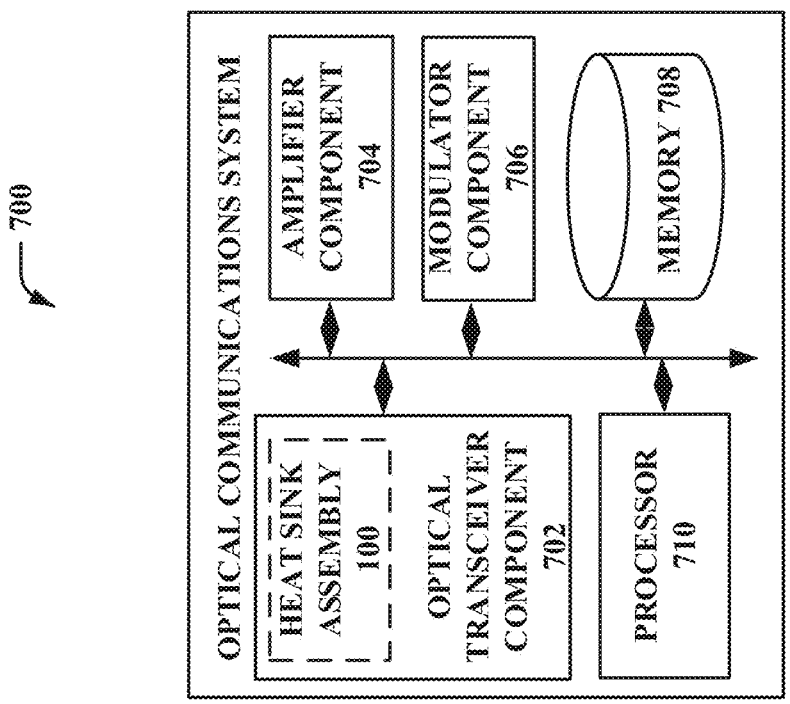
FIG. 7 illustrates a non-limiting system comprising a heat sink assembly in accordance with one or more embodiments described herein.

FIG. 7 illustrates a non-limiting system for use with a heat sink assembly in accordance with one or more embodiments described herein. The optical communications system 700 can comprise an optical transceiver component 702, an amplifier component 704, a modulator component 706, a processor 710, and a memory 708. The heat sink assembly 100, 200, 300, 400, 500, 600 can be used in conjunction with the optical transceiver component 702 to send and receive optical fiber data. It should be noted that the aforementioned components can be electrically and/or communicatively coupled to one another to bi-directionally communicate with one another in one or more embodiments. Repetitive description of like elements employed in other embodiments described herein is omitted for sake of brevity.

The optical communications system 700 can comprise an optical transceiver component 702 for sending and receiving optical fiber data. Although not shown, the optical communications system 700 can also comprise laser die, photodetector die, a semiconductor optical amplifier die, and/or light modulator die which are different types of die that can be attached to the carrier die 108. Because these die can lose alignment due to thermal expansion, a CTE associated with the spreader 102 can be matched to another CTE associated with the carrier die 108 to reduce the effects of thermal expansion. Therefore, the heat sink assembly 100, 200, 300, 400, 500, 600 can reduce thermal expansion within the optical transceiver component 702.

It should also be noted that in alternative embodiments that other components including, but not limited to the amplifier component 704, the modulator component 706, the processor 710, and the memory 708 can be external to the optical communications system 700. For instance, in another embodiment, the modulator component 706 can be external to the optical communications system 700.

Figure 8:
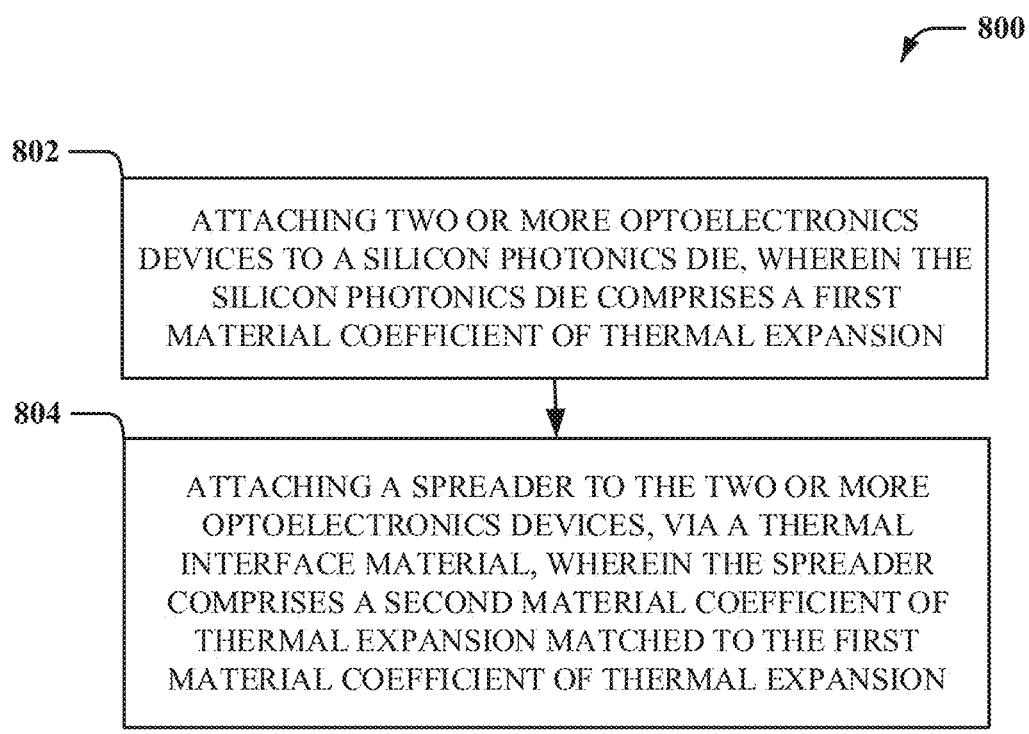
FIG. 8 illustrates a non-limiting flow diagram of an example, non-limiting method for developing a heat sink assembly in accordance with one or more embodiments described herein.

FIG. 8 illustrates a non-limiting flow diagram of an example, non-limiting method 800 for developing a heat sink assembly in accordance with one or more embodiments described herein. Repetitive description of like elements employed in other embodiments described herein is omitted for sake of brevity.

At element 802, the method can comprise attaching two or more optoelectronics devices (e.g., laser die 106) to a silicon photonics die, wherein the silicon photonics die (e.g., carrier die 108) comprises a first material coefficient of thermal expansion. At element 804, the method can comprise attaching a spreader 102 to the two or more optoelectronics devices (e.g., laser die 106), via a thermal interface material 104, wherein the spreader 102 comprises a second material coefficient of thermal expansion matched to the first material coefficient of thermal expansion. Thus, to maintain alignment of two or more optoelectronics devices, the spreader 102 and the silicon photonics die can comprise the same coefficients of thermal expansion. It should be noted that the carrier die 108 can be a silicon photonics die or any other carrier die (that comprises a matched CTE to the spreader) and the spreader 102 can be a silicon spreader. It should also be noted that in alternative embodiments, the optoelectronics devices can be photodetector die, semi-conductor optical amplifier die, light modulator die, etc.

FIG. 9 illustrates a non-limiting flow diagram of another example, non-limiting method 900 for developing a heat sink assembly in accordance with one or more embodiments described herein. Repetitive description of like elements employed in other embodiments described herein is omitted for sake of brevity.

At element 902, the method can comprise attaching two or more optoelectronics devices (e.g., laser die 106) to a silicon photonics die, wherein the silicon photonics die (e.g., carrier die 108) comprises a first material coefficient of thermal expansion. At element 904, the method can comprise attaching a spreader 102 to the two or more optoelectronics devices (e.g., laser die 106), via a thermal interface material 104, wherein the spreader 102 comprises a second material coefficient of thermal expansion matched to the first material coefficient of thermal expansion. At element 906, a conductive layer 202 can be deposited on the thermal interface material 104 prior to the attaching the spreader 102 to the two or more optoelectronics devices (e.g., laser die 106). It should be noted that the conductive layer 202 can facilitate an electrical connection associated with the heat sink assembly 100, 200, 300, 400, 500, 600. Thus, to maintain alignment of two or more optoelectronics devices, the spreader 102 and the silicon photonics die can comprise the same coefficients of thermal expansion. It should be noted that the carrier die 108 can be a silicon photonics die or any other carrier die (that comprises a matched CTE to the spreader) and the spreader 102 can be a silicon spreader. It should also be noted that in alternative embodiments, the optoelectronics devices can be photodetector die, semi-conductor optical amplifier die, light modulator die, etc.

FIG. 10 illustrates a non-limiting flow diagram of another example, non-limiting method 1000 for developing a heat sink assembly in accordance with one or more embodiments described herein. Repetitive description of like elements employed in other embodiments described herein is omitted for sake of brevity.

At element 1002, the method can comprise attaching two or more optoelectronics devices (e.g., laser die 106) to a silicon photonics die, wherein the silicon photonics die (e.g., carrier die 108) comprises a first material coefficient of thermal expansion. At element 1004, the method can comprise attaching a spreader 102 to the two or more optoelectronics devices (e.g., laser die 106), via a thermal interface material 104, wherein the spreader 102 comprises a second material coefficient of thermal expansion matched to the first material coefficient of thermal expansion. At element 1006, the spreader 102 can be encased in the conductive layer 202 prior to the attaching the spreader 102 to the two or more optoelectronics devices (e.g., laser die 106). It should be noted that the electrically conductive layer 202 can facilitate an electrical connection associated with the heat sink assembly 100, 200, 300, 400, 500, 600. Thus, to maintain alignment of two or more optoelectronics devices, the spreader 102 and the silicon photonics die can comprise the same coefficients of thermal expansion. It should be noted that the carrier die 108 can be a silicon photonics die or any other carrier die (that comprises a matched CTE to the spreader) and the spreader 102 can be a silicon spreader. It should also be noted that in alternative embodiments, the optoelectronics devices can be photodetector die, semi-conductor optical amplifier die, light modulator die, etc.

Figure 11:
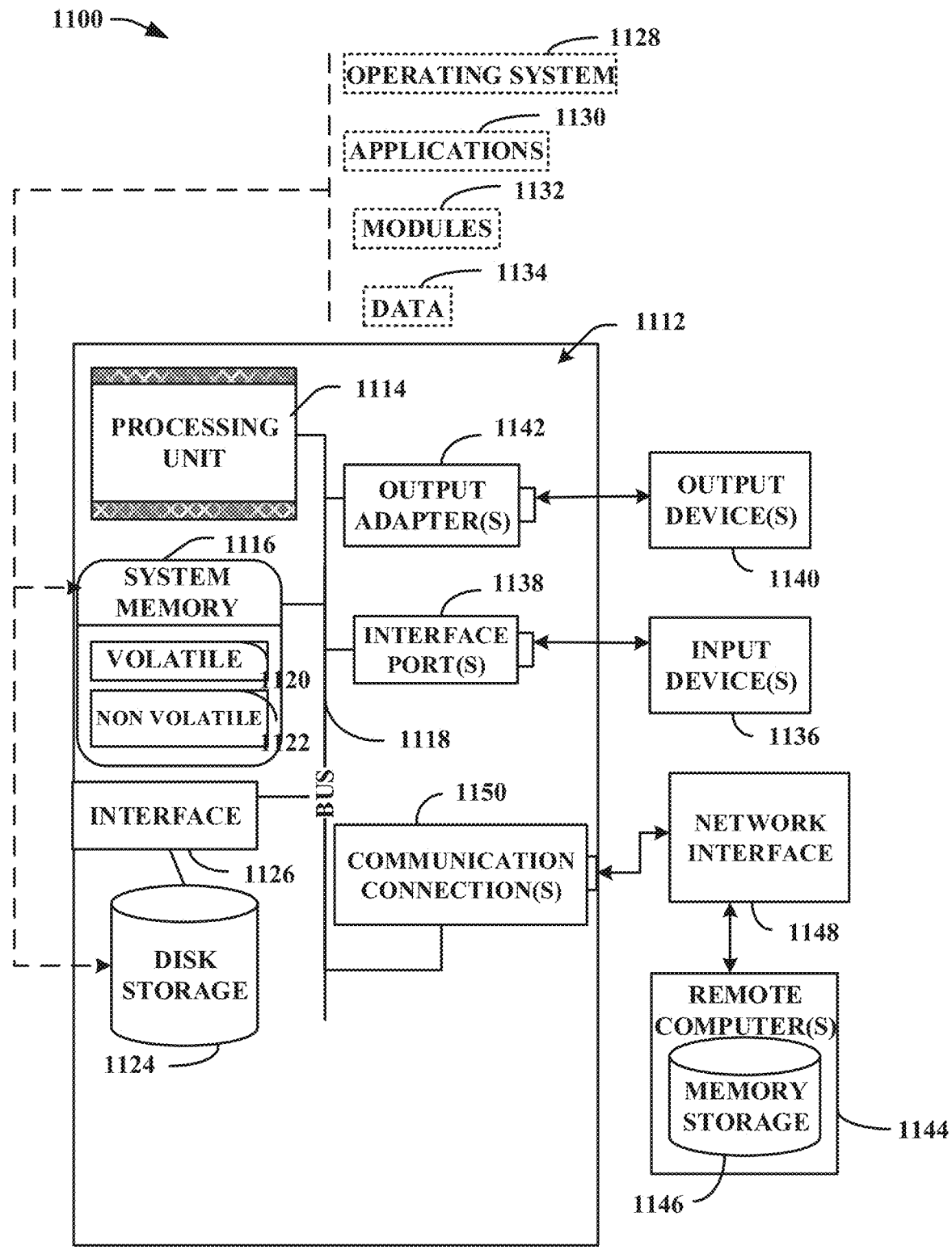
FIG. 11 illustrates a block diagram of an example, non-limiting operating environment in which one or more embodiments described herein can be facilitated.

In order to provide a context for the various aspects of the disclosed subject matter, FIG. 11 as well as the following discussion is intended to provide a general description of a suitable environment in which the various aspects of the disclosed subject matter can be implemented. FIG. 11 illustrates a block diagram of an example, non-limiting operating environment in which one or more embodiments described herein can be facilitated. With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1111 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1112 can also include removable/non-removable, volatile/nonvolatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-160 drive, flash memory card, or memory stick. The disk storage 1124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. An entity enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present disclosure may be a system, a method, an apparatus and/or a computer program product at any possible technical detail level of integration. The computer program product can include a computer readable storage medium (or media) having computer readable program instructions thereon for causing a processor to carry out aspects of the present disclosure. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present disclosure can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely or partly on a computer for an entity, as a stand-alone software package, and/or partly on a remote computer or entirely on the remote computer or server. In the latter scenario, the remote computer can be connected to the entity computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a carrier die comprising a first material coefficient of thermal expansion, wherein the carrier die comprises a silicon photonics die;
   two or more die disposed on the carrier die; and
   a spreader comprising a second material coefficient of thermal expansion matched to the first material coefficient of thermal expansion, wherein the two or more die are distinct from the carrier die.

2. The system of claim 1, further comprising:
   a thermal interface material disposed between the spreader and the two or more die.

3. The system of claim 1, wherein the two or more die are selected from a group consisting of: a laser die and a semiconductor amplifier die.

4. The system of claim 1, wherein the two or more die are selected from a group consisting of: a photodetector die and a photonic modulator die.

5. The system of claim 1, wherein the two or more die are electronic integrated circuit die.

6. The system of claim 1, further comprising:
   an optical transceiver that sends optical fiber data to and receives optical fiber data from the carrier die.

7. An apparatus, comprising:
   a spreader comprising a first material coefficient of thermal expansion;
   two or more die;
   a thermal interface material between the spreader and the two or more die; and
   a silicon photonics die comprising a second material coefficient of thermal expansion that is the same as the first material coefficient of thermal expansion, wherein the two or more die are distinct from the silicon photonics die.

8. The apparatus of claim 7, wherein the spreader comprises a column disposed adjacent to the silicon photonics die.

9. The apparatus of claim 8, wherein the thermal interface material is a first thermal interface material, and wherein a second thermal interface material is disposed between the column and the silicon photonics die.

10. The apparatus of claim 7, further comprising:
    a conductive layer that encapsulates the spreader.

11. The apparatus of claim 10, wherein the thermal interface material bonds the conductive layer to the two or more die.

12. The apparatus of claim 10, wherein the conductive layer electrically couples the spreader to an electrical signal external to the apparatus.

13. The apparatus of claim 7, wherein the spreader comprises a silicon carbide material.

14. The apparatus of claim 10, wherein the spreader comprises a column disposed adjacent to the silicon photonics die, and the spreader is encapsulated in the conductive layer to electrically couple to the silicon photonics die, resulting in an electrical connection.

15. The apparatus of claim 14, wherein the column connects a ground or a power to the silicon photonics die to facilitate the electrical connection.

16. A method comprising:
   attaching devices to a silicon photonics die comprising a first material coefficient of thermal expansion; and
   attaching a spreader to the devices, wherein the spreader comprises a second material coefficient of thermal expansion matched to the first material coefficient of thermal expansion.

17. The method of claim 16, further comprising:
   depositing a conductive layer on a thermal interface material between the spreader and the devices prior to the attaching the spreader to the two or more devices.

18. The method of claim 16, further comprising:
   encasing the spreader in a conductive layer prior to the attaching the spreader to the two or more devices.

19. The method of claim 18, wherein the spreader further comprises a column to electrically connect the spreader to the silicon photonics die.

20. The method of claim 19, wherein the thermal interface material is a first thermal interface material, and the method further comprising:
   depositing a second thermal interface material between the column and the silicon photonics die.

\* \* \* \* \*